United States Patent [19]

Kitatani et al.

[11] Patent Number: 4,948,688
[45] Date of Patent: Aug. 14, 1990

[54] LAYERED ELECTROPHOTOGRAPHIC PHOTORECEPTOR COMPRISES BIS-AZO CHARGE GENERATOR COMPOUND

[75] Inventors: Katsuji Kitatani; Satoshi Hoshi, both of Kanagawa, Japan

[73] Assignee: Fuji Photo Film Co., Ltd., Kanagawa, Japan

[21] Appl. No.: 331,986

[22] Filed: Apr. 3, 1989

[30] Foreign Application Priority Data

Apr. 5, 1988 [JP] Japan .................................. 63-83676

[51] Int. Cl.$^5$ ................................. G03G 5/14
[52] U.S. Cl. ........................................ 430/58; 430/72; 430/74; 250/492.2; 136/263
[58] Field of Search ....................... 430/57, 58, 59, 72, 430/74

[56] References Cited

U.S. PATENT DOCUMENTS 4,440,845  4/1984  Hashimoto ...................... 430/73 X Primary Examiner—J. David Welsh
Attorney, Agent, or Firm—Sughrue, Mion, Zinn, Macpeak & Seas

[57] ABSTRACT

An electrophotographic photoreceptor comprising: (1) an electrophotographic photosensitive layer which comprises a charge carrier transporting compound and a charge carrier generating compound, or (2) an electrophotographic photosensitive layer which comprises a charge carrier transporting compound layer and a charge carrier generating compound layer, on an electrically conductive support, wherein said charge carrier generating compound is a bis-azo compound represented by formula (I):

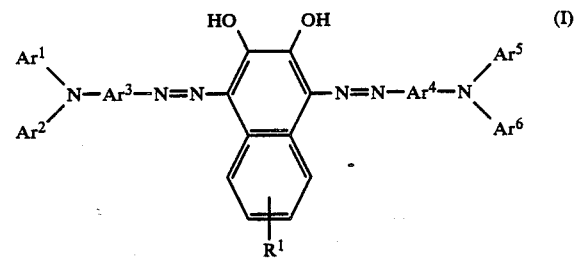

wherein, $Ar^1$, $Ar^2$, $Ar^5$ and $Ar^6$ represent aryl groups, $Ar^3$ and $Ar^4$ represent arylene groups, and $R^1$ represents a hydrogen atom or an $SO_3Na$ group.

6 Claims, No Drawings

LAYERED ELECTROPHOTOGRAPHIC PHOTORECEPTOR COMPRISES BIS-AZO CHARGE GENERATOR COMPOUND

FIELD OF THE INVENTION

This invention concerns an electrophotographic photoreceptor which is distinguished by having an electrophotographic photosensitive layer which contains a novel bis-azo compound.

BACKGROUND OF THE INVENTION

Inorganic substances such as selenium, cadmium sulfide, zinc oxide and amorphous silicon were well known in the photoconductive compositions used in the past for electrophotographic photoreceptors.

These inorganic photoreceptors had the advantage of providing good electrophotographic characteristics, which is to say that they provided extremely good photoconductivity and extremely good charge accepting characteristics and insulation properties in the dark. However, they also had various disadvantages. For example, selenium photoreceptors are very expensive to manufacture and they lack flexibility. They also have the disadvantage of being weak in respect of both thermal and mechanical shock. Cadmium sulfide photoreceptors give rise to problems with pollution since toxic cadmium is used in these materials. Zinc oxide photoreceptors give rise to problems with image stability when it is used repetitively over long periods of time. Moreover, amorphous silicon photoreceptors are very expensive to manufacture and have a further disadvantage in that a special surface treatment is required to prevent degradation of the surface of the photoreceptor.

In recent years, electrophotographic photoreceptors in which various organic substances are used have been suggested as a means of overcoming the problems associated with these inorganic substances, and some of these have been put to practical use. For example, there are electrophotographic photoreceptors consisting of poly(N-vinylcarbazole) and 2,4,7-trinitrofluoren-9-one (U.S. Pat. No. 3,484,237), those consisting of poly(N-vinylcarbazole) sensitized with pyrylium salt based dyes (JP-B-48-25658) and electrophotographic photoreceptors in which the principal component is a co-crystalline complex consisting of dye and resin (JP-A-47-10735). (The terms "JP-A" and "JP-B" as used herein mean an "unexamined published Japanese patent application" and "an examined Japanese patent publication" respectively.)

Furthermore, much active research has been carried out recently in connection with electrophotographic photoreceptors in which organic pigments, such as perylene pigments (e.g. U.S. Pat. No. 3,317,884), phthalocyanine pigments (e.g. U.S. Pat. Nos. 3,397,086 and 4,666,802), azulenium salt based pigments (e.g. JP-A-59-53850 and JP-A-61-212542), squalium salt pigments (e.g. U.S. Pat. Nos. 4,396,610 and 4,644,082), and polycyclic quinone based pigments (e.g. JP-A-59-184348 and JP-A-62-28738) or azo pigments described below are used as a principal component, and many suggestions have been made in this connection.

Bis-Azo Based Pigments

JP-A-47-37543, JP-B-60-5941, JP-B-60-45664, JP-A-56-116039, JP-A-58-123541, JP-A-61-260250, JP-A-61-228453, JP-A-61-275849, JP-A-61-275850.

These organic electrophotographic photoreceptors are somewhat better than the afore-mentioned inorganic electrophotographic photoreceptors in respect of mechanical properties and flexibility, but they have a low photosensitivity, and in some cases they cannot be used repeatedly for a large number of times, and they do not fulfill satisfactorily all of the requirements for electrophotographic photoreceptors.

SUMMARY OF THE INVENTION

One aim of the invention is to provide a novel electrophotographic photoreceptors which has high sensitivity and which has a high degree of durability.

A further aim of the invention is to provide a novel electrophotographic photoreceptor in which the loss of photosensitivity is small when they are used repetitively.

This invention concerns electrophotographic photoreceptors comprising: (1) an electrophotographic photosensitive layer which comprises a charge carrier transporting compound and a charge carrier generating compound, or: (2) an electrophotographic photosensitive layer which comprises a charge carrier transporting compound layer and a charge carrier generating compound layer, on an electrically conductive support, wherein the charge carrier generating compound is a bis-azo compound represented by formula (I):

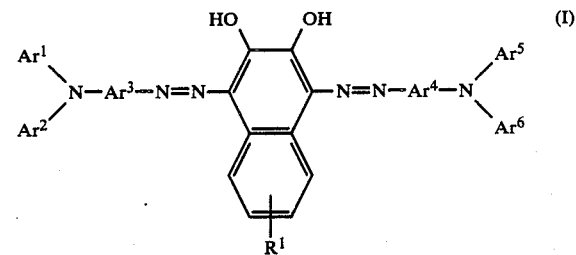

wherein, $Ar^1$, $Ar^2$, $Ar^5$ and $Ar^6$ represent aryl groups, $Ar^3$ and $Ar^4$ represent arylene groups, and $R^1$ represents a hydrogen atom or an $SO_3Na$ group.

DETAILED DESCRIPTION OF THE INVENTION

The bis-azo compounds which can be represented by the formula (I) are described in more detail below.

$Ar^1$, $Ar^2$, $Ar^5$ and $Ar^6$ are aryl groups which have from 6 to 28 carbon atoms (for example, phenyl, naphthyl, anthryl, biphenyl, terphenyl, binaphtyl).

The aryl groups represented by $Ar^1$, $Ar^2$, $Ar^5$ and $Ar^6$ may have substituent groups, such as hydroxyl groups, alkoxy groups which have from 1 to 18 carbon atoms (e.g. methoxy, ethoxy, n-butoxy), cyano groups, alkylamino groups which have from 1 to 18 carbon atoms (e.g. N-methylamino, N-ethylamino, N-n-octylamino), dialkylamino groups which have two alkyl groups which have from 1 to 18 carbon atoms (e.g. N,N-dimethylamino, N-methyl-N-ethylamino), halogen atoms (e.g. fluorine, chlorine, bromine, or iodine), nitro groups, trifluoromethyl groups, aryl groups which have from 6 to 15 carbon atoms (e.g. phenyl, naphthyl, biphenyl) and acyl groups which have from 1 to 18 carbon atoms (e.g. acetyl, butyryl, benzoyl).

$Ar^3$ and $Ar^4$ are arylene groups which have from 6 to 28 carbon atoms (for example, phenylene, naphthalene, anthrylene, biphenylene, terphenylene, binaphthalene). The arylene groups represented by $Ar^3$ and $Ar^4$ may have substituent groups, such as hydroxyl groups, alkoxy groups which have from 1 to 18 carbon atoms (e.g. methoxy, ethoxy, n-butoxy), cyano groups, alkylamino groups which have from 1 to 18 carbon atoms (e.g. N-methylamino, N-ethylamino, N-n-octylamino), dialkylamino groups which have two alkyl groups which have from 1 to 18 carbon atoms (e.g. N,N-dimethylamino, N-methyl-N-ethylamino) halogen atoms (e.g. fluorine, chlorine, bromine, or iodine), nitro groups, trifluoromethyl groups, aryl groups which have from 6 to 14 carbon atoms (e.g. phenyl, naphthy, biphenyl) and acyl groups which have 1 to 18 carbon atoms (e.g. acetyl, butyryl, benzoyl).

Typical examples of bis-azo compounds of this invention are listed in Table 1 (where the actual substituent groups in formula (I) are shown). The invention is not, of course, limited by the examples.

TABLE 1

| Compound No. | $R^1$ | $Ar^1$ | $Ar^2$ | $Ar^3$ | $Ar^4$ | $Ar^5$ | $Ar^6$ |
|---|---|---|---|---|---|---|---|
| 1 | H | —C₆H₄—Cl | —C₆H₄—NO₂ | —C₆H₄— | —C₆H₄— | —C₆H₄—Cl | —C₆H₄—NO₂ |
| 2 | H | —C₆H₄—CH₃ | —C₆H₄—NO₂ | —C₆H₄— | —C₆H₄— | —C₆H₄—CH₃ | —C₆H₄—NO₂ |
| 3 | H | —C₆H₄—OCH₃ | —C₆H₄—NO₂ | —C₆H₄— | —C₆H₄— | —C₆H₄—OCH₃ | —C₆H₄—NO₂ |
| 4 | H | —C₆H₄—CN | —C₆H₄—NO₂ | —C₆H₄— | —C₆H₄— | —C₆H₄—CN | —C₆H₄—NO₂ |
| 5 | H | —C₆H₅ | —C₆H₅ | —C₆H₄— | —C₆H₄— | —C₆H₅ | —C₆H₅ |
| 6 | H | —C₆H₄—NO₂ | —C₆H₄—NO₂ | —C₆H₄— | —C₆H₄— | —C₆H₅ | —C₆H₅ |
| 7 | H | —C₆H₄—CH₃ | —C₆H₄—NO₂ | —C₆H₄— | —C₆H₄— | —C₆H₅ | —C₆H₅ |
| 8 | H | —C₆H₄—OCH₃ | —C₆H₄—NO₂ | —C₆H₄— | —C₆H₄— | —C₆H₅ | —C₆H₅ |
| 9 | H | —C₆H₄—CN | —C₆H₄—NO₂ | —C₆H₄— | —C₆H₄— | —C₆H₅ | —C₆H₅ |
| 10 | H | —C₆H₄—Cl | —C₆H₄—NO₂ | —C₆H₄— | —C₆H₄— | —C₆H₅ | —C₆H₅ |
| 11 | H | —C₆H₄—NO₂ | —C₆H₄—NO₂ | —C₆H₄— | —C₆H₄— | —C₆H₄—NO₂ | —C₆H₄—NO₂ |
| 12 | H | —C₆H₄—CF₃ | —C₆H₄—NO₂ | —C₆H₄— | —C₆H₄— | —C₆H₅ | —C₆H₅ |
| 13 | H | 2-Cl-C₆H₄— | —C₆H₄—NO₂ | —C₆H₄— | —C₆H₄— | —C₆H₅ | —C₆H₅ |
| 14 | H | 3-Cl-C₆H₄— | —C₆H₄—NO₂ | —C₆H₄— | —C₆H₄— | —C₆H₅ | —C₆H₅ |
| 15 | H | 2,4,5-Cl₃-C₆H₂— | —C₆H₄—NO₂ | —C₆H₄— | —C₆H₄— | —C₆H₅ | —C₆H₅ |
| 16 | H | —C₆H₄—N(CH₃)₂ | —C₆H₄—NO₂ | —C₆H₄— | —C₆H₄— | —C₆H₅ | —C₆H₅ |

TABLE 1-continued

| Compound No. | $R^1$ | $Ar^1$ | $Ar^2$ | $Ar^3$ | $Ar^4$ | $Ar^5$ | $Ar^6$ |
|---|---|---|---|---|---|---|---|
| 17 | H | –C₆H₄–NHCOCH₃ | –C₆H₄–NO₂ | –C₆H₄– | –C₆H₄– | –C₆H₄– | –C₆H₄– |
| 18 | H | 2-Cl-C₆H₄– | –C₆H₄–NO₂ | –C₆H₄– | –C₆H₄– | 2-Cl-C₆H₄– | –C₆H₄–NO₂ |
| 19 | H | 3-Cl-C₆H₄– | –C₆H₄–NO₂ | –C₆H₄– | –C₆H₄– | 3-Cl-C₆H₄– | –C₆H₄–NO₂ |
| 20 | H | 2,4,5-Cl₃-C₆H₂– | –C₆H₄–NO₂ | –C₆H₄– | –C₆H₄– | 2,4,5-Cl₃-C₆H₂– | –C₆H₄–NO₂ |
| 21 | H | –C₆H₄–N(CH₃)₂ | –C₆H₄–NO₂ | –C₆H₄– | –C₆H₄– | –C₆H₄–N(CH₃)₂ | –C₆H₄–NO₂ |
| 22 | H | –C₆H₄–NHCOCH₃ | –C₆H₄–NO₂ | –C₆H₄– | –C₆H₄– | –C₆H₄–NHCOCH₃ | –C₆H₄–NO₂ |
| 23 | H | –C₆H₄–NO₂ | –C₆H₄–NO₂ | –C₆H₃(CH₃)– | –C₆H₃(CH₃)– | –C₆H₄– | –C₆H₄– |
| 24 | H | –C₆H₅ | –C₆H₅ | –C₆H₃(CH₃)– | –C₆H₃(CH₃)– | –C₆H₄– | –C₆H₄– |
| 25 | H | –C₆H₄–NO₂ | –C₆H₄–NO₂ | –C₆H₃(CH₃)– | –C₆H₃(CH₃)– | –C₆H₄–NO₂ | –C₆H₄–NO₂ |
| 26 | H | –C₆H₄–Cl | –C₆H₄–Cl | –C₆H₄– | –C₆H₄– | –C₆H₄–Cl | –C₆H₄–Cl |
| 27 | SO₃Na | –C₆H₅ | –C₆H₅ | –C₆H₄– | –C₆H₄– | –C₆H₅ | –C₆H₅ |
| 28 | SO₃Na | –C₆H₄–CH₃ | –C₆H₄–NO₂ | –C₆H₄– | –C₆H₄– | –C₆H₄–CH₃ | –C₆H₄–NO₂ |
| 29 | SO₃Na | –C₆H₄–OCH₃ | –C₆H₄–NO₂ | –C₆H₄– | –C₆H₄– | –C₆H₄–OCH₃ | –C₆H₄–NO₂ |
| 30 | SO₃Na | –C₆H₄–CN | –C₆H₄–NO₂ | –C₆H₄– | –C₆H₄– | –C₆H₄–CN | –C₆H₄–NO₂ |
| 31 | SO₃Na | –C₆H₄–Cl | –C₆H₄–NO₂ | –C₆H₄– | –C₆H₄– | –C₆H₄–Cl | –C₆H₄–NO₂ |
| 32 | SO₃Na | –C₆H₄–NO₂ | –C₆H₄–NO₂ | –C₆H₄– | –C₆H₄– | –C₆H₄–NO₂ | –C₆H₄–NO₂ |

The novel bis-azo compounds of this invention can be prepared easily using known methods. For example, bis-azo compounds in which $R^1$ in formula (I) is a hydrogen atom and $Ar^3$ and $Ar^4$ are p-phenylene groups can be prepared using the method outlined below.

A triarylamine of formula (II) in which $R^2$ is an $NO_2$ group is reduced with iron powder and dilute hydrochloric acid, or with stannous chloride and hydrochloric acid, to convert it into a compound in which $R^2$ is an $-NH_2$ group.

This compound is then diazotized, after which the target compound can be prepared easily by means of a coupling reaction with 2,3-dihydroxynaphthalene.

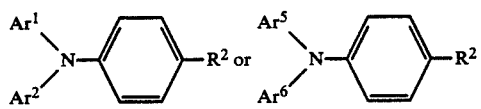 (II)

In the case of an asymmetric bis-azo compound, the coupling reaction can be carried out in two stages using the diazonium salts of different triarylamines.

The synthesis of Compound No. 1 is described below as a typical example.

SYNTHESIS EXAMPLE

Bis(p-nitrophenyl)-p-chlorophenylamine (3.70 grams, 0.010 mol) obtained by the Ullmann condensation of p-chloroaniline and p-nitroiodobenzene was mixed with 125 ml of N,N-dimethylformamide and 2,50 grams (0.045 mol) of iron powder, and dilute hydrochloric acid prepared using 1.5 ml of concentrated hydrochloric acid and 4 ml of water was added to the mixture which was then reacted for 1 hour at 100° C. The mixture was then neutralized by the addition of a saturated aqueous solution of sodium carbonate and the resulting mixture was filtered while hot. The filtrate was poured into 1.5 liters of ice water and 2.33 grams (yield 69%) of p-aminophenyl-p-nitrophenyl-p-chlorophenylamine was obtained on recovering the material which precipitated out by filtration.

Next, 1.98 grams (0.0058 mol) of this amino compound was added to dilute hydrochloric acid prepared using 5 ml of concentrated hydrochloric acid and 10 ml of water and the resulting mixture was stirred thoroughly for 1 hour on a water bath at 60°. Then, the mixture was cooled to 0° C. and a solution obtained by dissolving 0.48 grams (0.0070 mol) of sodium sulfite in 15 ml of water was added dropwise over a period of 5 minutes at 0° C. The resulting mixture was stirred for 50 minutes, and after removing a small amount of unreacted material by filtration, the filtrate was transferred to another reaction vessel and 9,44 grams of fluoroboric acid was added dropwise with ice cooling. The brown colored crystals which precipitated out were recovered by filtration, washed with water and dried, whereupon 2.52 grams (yield 99%) of the diazonium salt was obtained.

A solution consisting of 0.130 gram (0.0008 mol) of 2,3-dihydroxynaphthalene and 30 ml of N,N-dimethylformamide was prepared in a separate reaction vessel, and 0.720 gram (0.0016 mol) of the diazonium salt and 2 ml of an aqueous solution of 0.99 gram (0.012 mol) of sodium acetate were added sequentially to this solution with ice cooling and stirring. The mixture was stirred for 3 hours at 0° C., after which the crystals were recovered by filtration and washed with water. Then the crystals were washed repeatedly with N,N-dimethylformamide and acetone and dried, whereupon 0.43 gram (yield 61%) of Compound No. 1 was obtained in the form of a dark green colored powder. Decomposition Temperature: Above 300° C.

Elemental Analysis, as $C_{46}H_{30}N_8O_6C_{12}$
Calculated: C 64.12%, H 3.51%, N 13.00%, Cl 8.23%
Found: C 64.02%, H 3,39%, N 12.89%, Cl 8.33%

The electrophotographic photoreceptors of this invention have an electrophotographic photosensitive layer which contains one or more of the bis-azo compounds represented by the afore-mentioned formula (I). Various embodiments of electrophotographic photoreceptors are known, and the electrophotographic photoreceptors of this invention may be of any type, but they normally have one of the electrophotographic photoreceptor structure types indicated below.

(1) Embodiments in which an electrophotographic photosensitive layer in which a bis-azo compound is dispersed in a binder or in a charge carrier transporting medium is coated on an electrically conductive support.

(II) Embodiments in which a charge carrier generating layer in which a bis-azo compound forms the principal component is coated on an electrically conductive support and in which a charge carrier transporting compound layer is coated over this layer.

The bis-azo compounds of this invention act in such a manner as to generate charge carriers very efficiently when they absorb light. The generated charge carriers are then transported by the charge carrier transporting compounds.

To prepare type (I) electrophotographic photoreceptors, fine particles of the bis-azo compound can be dispersed in a binder solution or a solution obtained by dissolving a charge carrier transporting compound and a binder, and the dispersion can be coated onto an electrically conductive support and dried. The thickness of the electrophotographic photosensitive layer at this time is from 3 to 30 $\mu$, and preferably from 5 to 20 $\mu$.

To prepare type (II) electrophotographic photoreceptors, the bis-azo compound can be vacuum vapor deposited, or coated as solution in a solvent such as an amine, onto an electrically conductive support, or fine particles of the bis-azo compound can be dispersed in an appropriate solvent, or in a solvent in which a binder has been dissolved, as required, and coated on the electrically conductive support and dried, after which a solution containing a charge carrier transporting compound and a binder can be coated thereon and dried. The thickness of the bis-azo compound containing layer which forms the charge carrier generating compound layer at this time is from 4 to 0.1 $\mu$, and preferably from 2 to 0.3 $\mu$, and the thickness of the charge carrier transporting compound layer is from 3 to 20 $\mu$, and preferably from 5 to 20 $\mu$.

The bis-azo compound used for photoreceptors of types (I) and (II) is pulverized to a particle size of from 5 to 0.1 $\mu$, and preferably of from 2 to 0.3 $\mu$, using a dispersing machine such as a ball mill, a sand mill, or a vibration mill for example.

If the amount of bis-azo compound used in type (I) electrophotographic photoreceptors is too small then the sensitivity is poor, and if the amount used is too large this may have an adverse effect on charging properties, or the strength of the electrophotographic photosensitive layer may be reduced, and the proportion of the bis-azo compound in the electrophotographic photosensitive layer is from about 0.01 to 2 times by weight, preferably from about 0.05 to 1 times by weight, more preferably about 0.07 to 0.9 times by weight, and most preferably about 0.1 to 0.8 times by weight, the amount of binder, and the proportion of charge carrier transporting compound which is added, if required, is from about 0.1 to 2 times by weight, preferably from about 0.3 to 1.3 times by weight, more preferably from about 0.4 to 1.2 times by weight, and most preferably from about 0.5 to 1.0 times by weight, the amount of binder. Furthermore, in cases where the charge carrier transporting compound itself is used as the binder, the amount of bis-azo compound added is preferably from about 0.01 to 0.5 times by weight, more preferably from about 0.05 to 0.5 times by weight, and most preferably from about 0.1 to 0.5 times by weight, the amount of binder.

Furthermore, when the bis-azo compound containing layer which forms the charge carrier generating compound layer in a type (II) electrophotographic photoreceptor is formed by coating, the amount of bis-azo compound used is preferably from about 0.1 to 3.0 times by weight, more preferably from about 0.2 to 2.0 by weight, and most preferably from about 0.5 to 1.5 by weight, the amount of binder resin, and adequate photosensitivity cannot be obtained with smaller amounts of the bis-azo compound. The proportion of charge carrier transporting compound in the charge carrier transporting layer is from about 0.2 to 2.0 times by weight, preferably about from 0.3 to 1.3 times by weight, more preferably from about 0.4 to 1.2 times by weight, and most preferably from about 0.5 to 1.0 times by weight, the amount of binder. In cases where a polymeric charge carrier transporting compound which can itself function as a binder is used, some other binder may or may not be used conjointly.

Additives such as plasticizers or sensitizing agents for example may be used together with the binder when forming the electrophotographic photoreceptors of this invention.

Metal sheets made of aluminum, copper or zinc, for example, electrically conductive materials made by the vapor deposition or dispersion coating of aluminum, indium oxide or $SnO_2$ for example on a plastic sheet or film made of polyester, for example, plastic films which have been coated with an acetonitrile solution of copper iodide, or papers which have been treated in such a manner as to be rendered electrically conductive using inorganic salts such as sodium chloride or calcium chloride, or using organic quaternary ammonium salts, for example, can be used as the electrically conductive supports for the electrophotographic photoreceptors of this invention.

As a binder used in the present invention, the use of electrically insulating film forming macromolecular polymers which are hydrophobic and which have a high dielectric constant is preferred. Macromolecular polymers of this type include those set forth below, but of course, the invention is not limited to the use of these polymers:

Polycarbonate, polyester, methacrylic resin, acrylic resin, poly(vinyl chloride), poly(vinylidene chloride), polystyrene, poly(vinly acetate), styrene/butadine copolymer, vinylidene chloride/acrylonitrile copolymer, vinyl chloride/vinyl acetate copolymer, vinyl chloride/vinyl acetate/maleic anhydride copolymer, silicon resins, silicon/alkyd resins, phenol/formaldehyde resins, styrene/alkyd resins, poly-N-vinylcarbazole.

These binders may be used individually, or mixtures of two or more types can be used.

Biphenyl, chlorinated biphenyl, o-terphenyl, p-terphenyl, dibutyl phthalate, dimethylglycol phthalate, dioctyl phthalate, triphenyl phosphate, methyl-naphthalene, benzophenone, chlorinated paraffin, polypropylene, polystyrene, dilaurylthiodipropionate, 3,5-dinitrosalicylic acid and various fluoro hydrocarbons can be used, for example, as plasticizers.

In addition, silicon oil may be added in order to improve sarface properties of the electrophotographic photoreceptors.

Chloranil, tetracyanoethylene, methyl violet, rhodamine B, cyan dyes, merocyanine dyes, pyrylium dyes and thiapyrylium dyes, for example, can be used as sentitizing agents.

The compounds which transport charge carriers can be generally classified into two categories, namely compounds which transport electrons and compounds which transport positive holes, and either of these types can be used in the invention. Compounds which have electron withdrawing groups, for example 2,4,7-trinitro-9-fluorenone, 2,4,5,7-tetranitro-9-fluorenone, 9-dicyanomethylene-2,4,7-trinitrofluorenone, 9-dicyanomethylene-2,4,5,7-tetranitrofluoroene, chloranyl, 2,3-dichloro-5,6-dicyanobenzoquinone, 2,4,7-trinitro-9,10-phenanthrenequinone, tetrachlorophthalic acid anhydride, tetracyanoethylene and tetracyanoquinodimethane can be used as compounds which transport electrons.

Compounds which have electron donating groups can be used as compounds which transport positive holes, and examples thereof include polymeric and low molecular weight compounds as set forth below.

Polymeric Compounds (1) Polyvinlcarbazole and derivatives thereof as disclosed, for example, in JP-B-34-10966.

(2) The vinyl polymers, such as polyvinlpyrene, polyvinylanthracene, poly-2-vinyl-4-(4'-dimethylaninophenyl)-5-phenyloxazole and poly-3-vinyl-N-ethylcarbazole disclosed, for example, in JP-B-43-8674 and JP-B-43-19192.

(3) The polymers such as polyacenaphthylene, polyindene and the copolymers of styrene with acenaphthylene disclosed, for example, in JP-B-43-9193.

(4) Condensed resins such as pyrene/formaldehyde resins, bromopyrene/formaldehyde resins and ethylcarbazole/formaldehyde resins as disclosed, for example, in JP-B-56-13940.

(5) The various types of triphenylmethane polymers disclosed, for example, in JP-A-56-90883 and JP-A-6-161550.

Low Molecular weight Compounds (6) The triazole derivatives disclosed, for example, in U.S. Pat. No. 3,112,197.

(7) The oxadiazole derivatives disclosed, for example, in U.S. Pat. No. 3,189,447.

(8) The imidazole derivatives disclosed, for example, in JP-B-37-16096.

(9) The polyarylalkane derivatives disclosed, for example, in U.S. Pat. Nos. 3,615,402, 3,820,989 and 3,542,544, JP-B-45-555, JP-B-51-10983, JP-A-51-3224, JP-A-55-108667, JP-A-55-156953 and JP-A-56-6656.

(10) The pyrazoline derivatives and pyrazolone derivatives disclosed, for example, in U.S. Pat. Nos. 3,180,729 and 4,278,746, JP-A-55-88064, JP-A-55-88065, JP-A-49-105537, JP-A-55-51086, JP-A-56-80051, JP-A-56-88141, JP-A-57-45545, JP-A-54-112637 and JP-A-55-74546.

(11) The phenylenediamine derivatives disclosed, for example, in U.S. Pat. Nos. 3,615,404, JP-B-51-10105, JP-A-54-83435, JP-A-54-110836, JP-A-54-119925, JP-B-46-3712 and JP-B-47-28336.

(12) The arylamine derivatives disclosed, for example, in U.S. Pat. No. 3,567,450, JP-B-49-35702, West German Patent (DAS) No. 1,110,518, U.S. Pat. Nos. 3,180,703, 3,240,597, 3,658,520, 4,232,103, 4,175,961 and 4,013,376, JP-A-55-144250, JP-A-56-119132, JP-B-39-27577 and JP-A-56-22437.

(13) The amino substituted chalcone derivatives disclosed, for example, in U.S. Pat. No. 3,526,501.

(14) The N,N-bicarbazyl derivatives disclosed, for example, in U.S. Pat. No. 3,542,546.

(15) The oxazole derivatives disclosed, for example, in U.S. Pat. No. 3,257,203.

(16) The styrylanthracene derivatives disclosed, for example, in JP-A-56-46234.

(17) The fluorenone derivatives disclosed, for example, in JP-A-54-110837.

(18) The hydrazone derivatives disclosed, for example, in U.S. Pat. No. 3,717,462, JP-A-54-59143 (corresponding to U.S. Pat. No. 4,150,987), JP-A-55-2063, JP-A-55-52064, JP-A-55-46760, JP-A-55-5495, JP-A-57-11350, JP-A-57-148749, and JP-A-57-04144.

(19) The benzidine derivatives disclosed, for example, in U.S. Pat. Nos. 4,047,948, 4,047,949, 4,265,990, 4,273,846, 4,299,897 and 4,306,008.

(20) The stilbene derivatives disclosed, for example, in JP-A-58-190953, JP-A-59-95540, JP-A-59-97148, JP-A-59-195658 and JP-A-62-36674.

Moreover, the compounds which can be used for transporting charge carriers in this invention are not limited to those listed under (1) to (20) above, and any of the already known charge carrier transporting compounds can be used for this purpose.

Two or more types of charge carrier transporting material can be used conjointly, depending on the particular case.

Moreover, adhesive layers or barrier layers can be established, as required, between the electrically conductive support and the photosensitive layer in the photoreceptors obtained by the ways outlined above. As well as the afore-mentioned macromolecular polymers which can be used as binders, materials such as gelatin, casein, poly(vinyl alcohol), ethylcellulose, carboxymethylcellulose, the vinylidene chloride based polymer latexes disclosed in JP-A-59-84247, the styrene/butadiene based polymer latexes disclosed in JP-A-59-114544, and aluminum oxide, can be used as the material used in these layers, and the layer thickness is preferably not more than 1 μm.

The electrophotographic photoreceptors of the invention have been described in detail above, and the electrophotographic photoreceptors of this invention are distinguished in general by having a high sensitivity and excellent durability.

The electrophotographic photoreceptors of this invention can be used in a wide range of applications, such as printers in which lasers and braun tubes are used as light sources, as well as in electrophotographic copying machines.

Photoconductive compositions which contain a bisazo compound of this invention can be used as photoconductive layers in the camera tubes of video cameras and as photoconductive layer for known solid state imaging elements which have a light receiving layer (photoconductive layer) established on the whole surface over a semiconductor circuit which is arrayed in one or two dimensions for signal transmission and scanning purposes. Furthermore, they can also be used as photoconductive layers for solar batteries as described by A. K. Chosh and Tom Feng in J. Appl. Phys., 49 (12), 5982 (1978).

Furthermore, the bis-azo compounds of this invention can be used as photoconductive colored grains in photoelectrophoresis systems and as colored grains in dry or wet type electrophotographic developing agents.

Furthermore, the bis-azo compounds of this invention can be dispersed in an alkaline soluble resin liquid such as a phenolic resin liquid along with the afore-mentioned charge carrier transporting compounds such as oxadiazole derivatives and hydrazine derivatives, coated onto an electrically conductive support such as an aluminum support and dried, after which the plate can be imagewise exposed, developed with a toner, and etched with an aqueous alkaline solution to provide printing plates with high resolution, high durability and high sensitivity, and for the production of printed circuits, as disclosed in JP-B-37-17162, JP-A-55-19063, JP-A-55-161250, and JP-A-57-147656.

EXAMPLES

The invention is described in practical terms by means of examples blow, but the invention is not limited by these examples. Moreover, in the examples the term "parts" signifies "parts by weight".

EXAMPLE 1

5 parts of the bis-azo compound No. 1 prepared in the synthesis example was dispersed for 1 hour using a paint shaker in a solution obtained by dissolving 5 parts of a polyester resin (trade name "Baylon 200", made by TOYOBO CO., LTD.) in 60 parts of chlorobenzene, after which it was coated using a wire round rod onto an electrically conductive support (a support made by establishing a vapor deposited film of aluminum on the surface of a polyethyleneterephthalate film of thickness 75 μm, with a resulting surface electrical resistance of $4 \times 10^2$ Ω) and dried to provide a charge generating layer of thickness 0.5 μm.

Next, a solution obtained by dissolving 3.6 parts of the N'-methyl-N'-phenylhydrazone of p-(diphenylamino)benzaldehyde (shown below) and 4 parts of the polycarbonate of bisphenol A in 13.3 parts of dichloromethane and 26.6 parts of 1,2-dichloroethane was coated over this charge generating layer and dried to form a charge transporting layer of thickness 11 μm, thus forming an electrophotographic photoreceptor which had an electrophotographic photosensitive layer consisting of 2 layers.

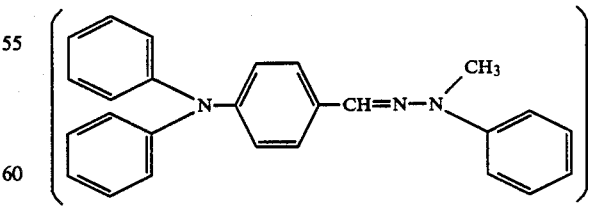

The initial surface potential $V_0$ was measured when the electrophotographic photoreceptor was negatively charged with a corona discharge of −6 kV using an electrostatic copying paper testing machine (model SP-428, made by Kawaguchi Denki Co.) and then the whole surface was exposed to light of a brightness of 10 lux at the photoreceptor surface using the light from tungsten lamp and the exposure E50 (lux.sec) required to reduce this surface potential to half the initial surface potential $V_0$ was measured.

Furthermore, this process was repeated 300 times using the same procedure. The results obtained are shown in Table 2.

TABLE 2

|  | First Time | 300th Time |
|---|---|---|
| $V_0$ (V) | −770 | −720 |
| $E_{50}$ (lux · sec) | 2.0 | 2.3 |

It is clear from these results that the photoreceptor of this invention has a high sensitivity and excellent durability.

COMPARATIVE EXAMPLE 1

An electrophotographic photoreceptor for comparative purposes was prepared in the same manner as that in Example 1 except that the bis-azo compound shown below was used for the charge generating compound, and the initial surface potential $V_0$ and the half reduction exposure $E_{50}$ were measured as described in Example 1.

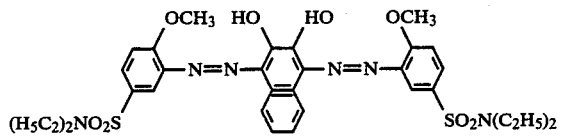

(disclosed in JP-A-57-195157)

The results obtained were $V_0 = -710$ V and $E_{50} = 42.9$ lux·sec.

It is clear from the results obtained in Example 1 and in Comparative Example 1 that the electrophotographic photoreceptor of this invention is more sensitive than the electrophotographic photoreceptor for comparative purposes.

EXAMPLES 2 to 32

Electrophotographic photoreceptors were prepared in the same manner as described in Example 1 using as the bis-azo pigments the illustrative compound Nos. 2 to 32 of this invention in place of the bis-azo pigment used in Example 1, and the values of $V_0$ and $E_{50}$ were measured. The results obtained are shown in Table 3.

TABLE 3

| Bis-azo Compound No. | $V_0$(V) | $E_{50}$ (lux · sec.) |
|---|---|---|
| 2 | −610 | 2.9 |
| 3 | −560 | 3.1 |
| 4 | −760 | 2.8 |
| 5 | −790 | 4.0 |
| 6 | −760 | 2.1 |
| 7 | −670 | 2.7 |
| 8 | −580 | 3.3 |
| 9 | −800 | 2.3 |
| 10 | −820 | 2.0 |
| 11 | −790 | 2.0 |
| 12 | −700 | 2.4 |
| 13 | −770 | 2.1 |
| 14 | −690 | 2.3 |
| 15 | −800 | 1.7 |
| 16 | −610 | 3.2 |
| 17 | −820 | 3.8 |
| 18 | −780 | 1.9 |
| 19 | −810 | 2.1 |
| 20 | −870 | 1.5 |
| 21 | −710 | 2.9 |
| 22 | −750 | 3.8 |
| 23 | −700 | 2.5 |
| 24 | −720 | 2.7 |
| 25 | −790 | 3.0 |
| 26 | −820 | 2.3 |
| 27 | −490 | 4.0 |
| 28 | −510 | 3.9 |
| 29 | −440 | 4.4 |
| 30 | −530 | 3.7 |
| 31 | −500 | 3.5 |
| 32 | −510 | 4.1 |

EXAMPLE 33

5 parts of the bis-azo compound compound No. 1 prepared in the synthesis example, 40 parts of the hydrazone compound used in Example 1 and 100 parts of a benzyl methacrylate/methacrylic acid copolymer (($\eta$), 30° C. in methyl ketone, =0.12, methacrylic acid content 32.9%) were added to 600 parts of dichloromethane and dispersed ultrasonically.

The dispersion was coated onto a sand blasted aluminum plate of thickness 0.25 mm and dried to provide an electrophotographic photosensitive printing plate material which had an electrophotographic photosensitive layer of dry film thickness of 6 μm.

This sample was charge until the surface potential of the photosensitive layer was about +650 V using a corona discharge (+6 kV) in the dark, after which it was exposed to a brightness at the sample surface of 2.0 lux using a tungsten lamp of color temperature 2854°K, and the half reduction exposure was 5.3 lux·sec.

Next, the sample was charged to a surface potential of about +450 V in the dark, after which it was exposed imagewise in contact with a transparent original which had a positive image. The sample was then immersed in a liquid developing solution which contained a toner prepared by adding 5 parts of poly(methyl methacrylate) (toner) dispersed in the form of fine particles and 0.01 parts of soy bean lecithin to 100 parts of Isoper H (made by the Esso Standard Co., a petroleum based solvent) and a clear positive toner image was obtained.

Moreover, the toner image was fixed by heating at 100° C. for a period of 30 seconds. This printing plate material was immersed for about 1 minute in a solution obtained by dissolving 70 parts of hydrated sodium metasilicate in 130 parts of glycerine, 530 parts of ethylene glycol and 160 parts of ethanol, after which it was rinsed with water and cleaned by brushing lightly, and a printing plate from which the electrophotographic photosensitive layer in the parts where no toner had been fixed had been removed was obtained.

Furthermore, the electrostatic image obtained was fixed by magnetic brush development with Xerox 3500 toner (made by Fuji Xerox Co., Ltd.) and then heating at 80° C. for a period of 30 seconds instead of using the liquid development bath. A printing plate was then obtained by removing the parts of the photosensitive layer on which no toner had been fixed with an alkali bath.

The printing plates prepared in the ways described above were used for printing in the usual manner on a Hamada Star 600CD offset printing machine, whereupon 50,000 very clear prints were obtained with no base staining.

As described above, the novel electrophotographic photoreceptors of this invention have excellent sensitivity and durability, and clearly exhibit little loss of sensitivity when used repetitively.

While the invention has been described in detail and with reference to specific embodiments thereof, it will be apparent to one skilled in the art that various changes and modifications can be made therein without departing from the spirit and scope thereof.

What is claimed is:

1. An electrophotographic photoreceptor comprising: (1) an electrophotographic photosensitive layer which comprises a charge carrier transporting compound and a charge carrier generating compound, or (2) an electrophotographic photosensitive layer which comprises a charge carrier transporting compound layer and a charge carrier generating compound layer, on an electrically conductive support, wherein said charge carrier generating compound is a bis-azo compound represented by formula (I):

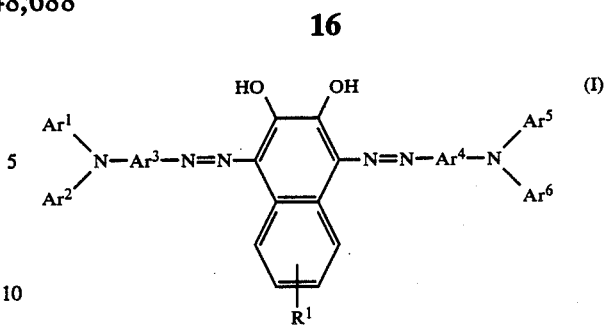

wherein, $Ar^1$, $Ar^2$, $Ar^5$ and $Ar^6$ represent aryl groups. $Ar^3$ and $Ar^4$ represent arylene groups, and $R^1$ represents a hydrogen atom or an $SO_3Na$ group.

2. The electrophotographic photoreceptor claimed in claim 1, wherein said electrophotographic photosensitive layer comprises a charge carrier transporting compound and a charge carrier generating compound.

3. The electrophotographic photoreceptor claimed in claim 1, wherein said electrophotographic photosensitive layer comprises a charge carrier transporting compound layer and a charge carrier generating compound layer.

4. The electrophotographic photoreceptor claimed in claim 2, wherein said photoreceptor contains a binder and the bis-azo compound in the electrophotographic photosensitive layer is present in an amount of from 0.01 to 2 times by weight an amount of binder.

5. The electrophotographic photoreceptor claimed in claim 2, wherein said photoreceptor contains a binder and the bis-azo compound in the electrophotographic photosensitive layer is present in an amount of from 0.05 to 1 times by weight an amount of binder.

6. The electrophotographic photoreceptor claimed in claim 3, wherein said charge carrier generating compound layer contains a binder and the bis-azo compound is present in an amount of from 0.1 to 3.0 times by weight an amount of binder.

* * * * *